United States Patent
Liu et al.

(10) Patent No.: US 9,378,864 B1
(45) Date of Patent: Jun. 28, 2016

(54) STRETCHABLE METAL WIRE ASSEMBLY USING ELASTIC TUBE

(71) Applicant: Flextronics AP, LLC, Broomfield, CO (US)

(72) Inventors: Weifeng Liu, Dublin, CA (US); Anwar Mohammed, San Jose, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 68 days.

(21) Appl. No.: 14/191,170

(22) Filed: Feb. 26, 2014

Related U.S. Application Data

(60) Provisional application No. 61/870,627, filed on Aug. 27, 2013, provisional application No. 61/870,646, filed on Aug. 27, 2013.

(51) Int. Cl.
*H01B 7/04* (2006.01)
*H01B 7/06* (2006.01)
*H02G 9/06* (2006.01)

(52) U.S. Cl.
CPC ... *H01B 7/04* (2013.01); *H01B 7/06* (2013.01)

(58) Field of Classification Search
USPC ........................................................ 174/68.1
See application file for complete search history.

(56) References Cited

U.S. PATENT DOCUMENTS

| | | | |
|---|---|---|---|
| 5,555,915 A * | 9/1996 | Kanao | 138/133 |
| 5,778,941 A * | 7/1998 | Inada | 138/134 |
| 6,103,971 A * | 8/2000 | Sato et al. | 174/47 |
| 6,192,940 B1 * | 2/2001 | Koma et al. | 138/122 |
| 7,156,127 B2 * | 1/2007 | Moulton et al. | 138/122 |
| 7,191,803 B2 | 3/2007 | Orr | |
| 7,424,189 B2 * | 9/2008 | Lu et al. | 385/100 |
| 7,573,727 B2 | 8/2009 | Hauenstein | |
| 7,735,523 B2 * | 6/2010 | Smith et al. | 138/118 |
| 8,258,011 B2 | 9/2012 | Brun | |
| 8,469,741 B2 | 6/2013 | Oster | |
| 8,861,220 B2 | 10/2014 | Loher | |
| 2002/0094701 A1 | 7/2002 | Biegelsen et al. | |
| 2003/0098084 A1 * | 5/2003 | Ragner et al. | 138/129 |
| 2003/0111126 A1 * | 6/2003 | Moulton et al. | 138/122 |
| 2003/0127246 A1 | 7/2003 | Watanabe | |
| 2003/0129905 A1 | 7/2003 | Dhawan et al. | |
| 2004/0229533 A1 | 11/2004 | Braekevelt et al. | |
| 2005/0022338 A1 * | 2/2005 | Muhlenkamp | 15/414 |
| 2005/0280157 A1 | 12/2005 | Roush | |
| 2007/0054511 A1 | 3/2007 | Ittel | |
| 2007/0089800 A1 | 4/2007 | Sharma | |
| 2007/0190881 A1 | 8/2007 | Shibaoka et al. | |
| 2007/0290305 A1 | 12/2007 | Oyama | |
| 2008/0180242 A1 | 7/2008 | Cottingham | |

(Continued)

*Primary Examiner* — Michael F Mcallister
(74) *Attorney, Agent, or Firm* — Haverstock & Owens LLP

(57) ABSTRACT

A stretchable metal wire assembly includes a metal wire positioned within an elastic tube. The form of the metal wire is such that when the elastic tube is in a relaxed, or non-stretched, state the metal wire forms a tortuous path, such as a waveform, along the elastic tube. The tortuous path of the metal wire provides slack such that as the elastic tube is stretched the slack is taken up. Once released, the elastic tube moves from the stretched position to the relaxed, non-stretched position, and slack is reintroduced into the metal wire in the form of the original tortuous path. The metal wire functions as an electrical conductor, thereby providing a device having an extendable length electrical conducting element. In some applications, the metal wire is electrically coupled at each end to an electrical interconnect component.

21 Claims, 15 Drawing Sheets

(56) References Cited

U.S. PATENT DOCUMENTS

| | | |
|---|---|---|
| 2009/0317639 A1* | 12/2009 | Axisa et al. ............... 428/411.1 |
| 2010/0117537 A1 | 5/2010 | Horppu et al. |
| 2010/0199901 A1 | 8/2010 | Kang et al. |
| 2011/0130060 A1 | 6/2011 | Chung et al. |
| 2011/0175630 A1 | 7/2011 | Bhattacharya |
| 2011/0198118 A1 | 8/2011 | Fang et al. |
| 2011/0269334 A1* | 11/2011 | Hsieh et al. ................ 439/502 |
| 2011/0275240 A1* | 11/2011 | Hsieh et al. ................ 439/502 |
| 2012/0314382 A1 | 12/2012 | Wesselmann |
| 2013/0161055 A1* | 6/2013 | Rule et al. ...................... 174/69 |
| 2014/0103116 A1 | 4/2014 | Martin |
| 2014/0209690 A1 | 7/2014 | Teng |
| 2014/0299362 A1 | 10/2014 | Park |

* cited by examiner

STRETCHABLE METAL WIRE ASSEMBLY USING ELASTIC TUBE

RELATED APPLICATIONS

This Patent Application claims priority under 35 U.S.C. 119 (e) of the U.S. Provisional Application Ser. No. 61/870,627, filed Aug. 27, 2013, and entitled "Interconnect Methods" and U.S. Provisional Application Ser. No. 61/870,646, filed Aug. 27, 2013, and entitled "Stretchable Metals". This application incorporates U.S. Provisional Application Ser. No. 61/870,627 and U.S. Provisional Application Ser. No. 61/870,646 in their entireties by reference.

FIELD OF THE INVENTION

The present invention is generally directed to the field of metal wires and electrical conductivity over the metal wires. More specifically, the present invention is directed to a stretchable metal wire assembly and electrical conductivity over the stretchable metal wire assembly.

BACKGROUND OF THE INVENTION

Electronic devices are increasingly being incorporated with stretchable materials, such as in wearable electronics. Metal wires are commonly used as electrical conductors in electronic devices. Although metal wires are bendable, such as in an electric cord, metal wires are themselves not stretchable. There is an ever increasing need to enable use of non-stretching metal wires with electronics devices implemented within stretchable materials.

SUMMARY OF THE INVENTION

Embodiments of a stretchable metal wire assembly are directed to a metal wire positioned within an elastic tube. The form of the metal wire is such that when the elastic tube is in a relaxed, or non-stretched, state the metal wire forms a tortuous path, such as a waveform, along the elastic tube. The tortuous path of the metal wire provides slack such that as the elastic tube is stretched the slack is taken up. A maximum stretched position corresponds to where the metal wire forms a straight line. Once released, the elastic tube moves from the stretched position to the relaxed, non-stretched position, and slack is reintroduced into the metal wire in the form of the original tortuous path. The metal wire functions as an electrical conductor, thereby providing a device having an extendable length electrical conducting element. In some embodiments, the metal wire is electrically coupled at each end to an electrical interconnect component.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a stretchable metal wire assembly. Those of ordinary skill in the art will realize that the following detailed description of the stretchable metal wire assembly is illustrative only and is not intended to be in any way limiting. Other embodiments of the stretchable metal wire assembly will readily suggest themselves to such skilled persons having the benefit of this disclosure.

Reference will now be made in detail to implementations of the stretchable metal wire assembly as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
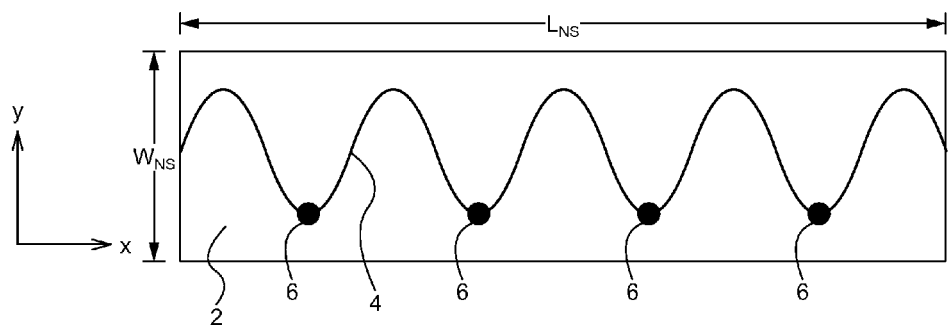
FIG. 1 illustrates a side view of a stretchable metal wire assembly according to an embodiment.

FIG. 1 illustrates a side view of a stretchable metal wire assembly according to an embodiment. The stretchable metal wire assembly includes an elastic substrate 2 and a metal wire 4 coupled to the elastic substrate 2. As shown in FIG. 1, the stretchable metal wire assembly is in a relaxed, or non-stretched, state. In the non-stretched state, the metal wire 4 forms a tortuous path relative to a stretchable direction of the elastic substrate 2, in this case the elastic substrate 2 is stretchable in both the x and y axis. In this manner, slack in the metal wire 4 is introduced relative to the direction of motion when the stretchable metal wire assembly is stretched. In some embodiments, the elastic substrate 2 is an elastic polymer, or elastomer, which is a polymer with viscoelasticity. It is understood that alternative elastic substrates can be used including, but not limited to, silicone, urethane, latex and spandex, also referred to as elastane.

In some embodiments, the metal wire 4 is secured to the elastic substrate 2 at a plurality of adhesion joints 6. The metal wire 4 can be secured to the elastic substrate 2 at each adhesion joint 6 using any known attach material that is capable of fixing in place the metal wire 4 to the elastic substrate 2 at the adhesion joint 6. Examples of such attach material include, but are not limited to silicone adhesive or epoxy based adhesive. The type of attach material used is dependent on the material used as the elastic substrate, the material used as the metal wire and the ability of the attach material to attach to these materials.

Figure 2:
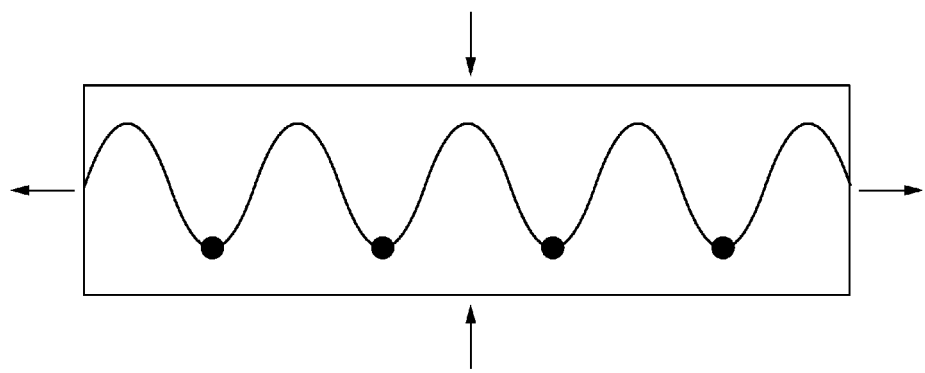
FIG. 2 illustrates exemplary force characteristics applied to the stretchable metal wire assembly of FIG. 1.
Figure 3:
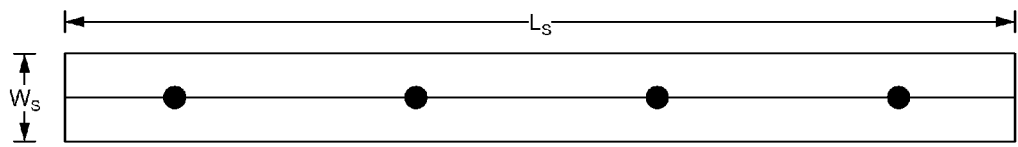
FIG. 3 illustrates the stretchable metal wire assembly in a stretched state.
Figure 4A:
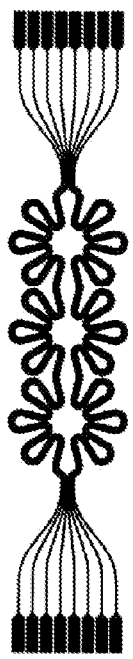
FIGS. 4A-4H illustrate exemplary alternative metal wire configurations.
Figure 4B:
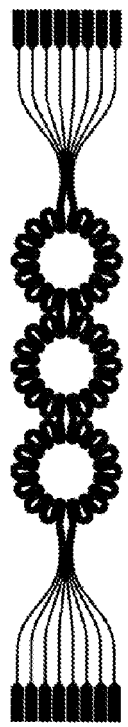
Figure 4C:
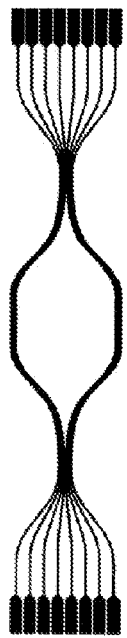
Figure 4D:
Figure 4E:
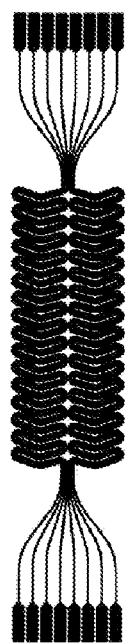
Figure 4F:
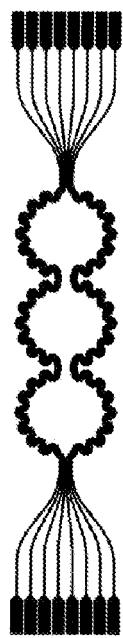
Figure 4G:
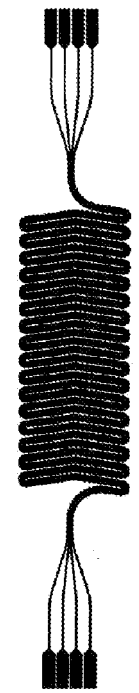
Figure 4H:
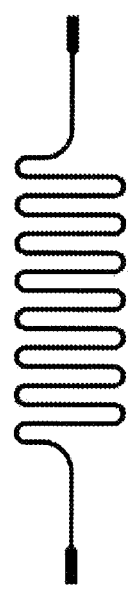

FIG. 1 shows the stretchable metal wire assembly in a non-stretched state. In the non-stretched state, the elastic substrate 2 has a non-stretched length $L_{NS}$ and a non-stretched width $W_{NS}$. When the elastic substrate 2 is stretched in the x-direction, there is a complementary compression of the elastic substrate 2 in the y-direction, as indicated by the force arrows in FIG. 2. The elastic substrate 2 can be stretched until a maximum stretched position where the metal wire forms a straight line, as shown in FIG. 3. In the maximum stretched position, the elastic substrate 2 has a stretched length $L_S$ and a stretched width $W_S$, where the stretched length $L_S$ is greater than the non-stretched length $L_{NS}$ and the stretched width $W_S$ is less than the non-stretched width $W_{NS}$. In practice, the stretchable metal wire assembly is designed to have a maximum stretchable length that is less than the distance corresponding to the metal wire forming a straight line. In this case, the maximum stretchable length is a function of the maximum stretchable length of the elastic substrate or some other limiting factor. Such a configuration minimizes metal fatigue by minimizing extreme bending back and forth of the metal wire that comes with stretching and releasing of the elastic substrate.

In the example shown above, the elastic substrate 2 is stretched in the x-direction. It is understood that the stretchable metal wire assembly can also configured to accommodate stretching in the y-direction and/or the z-direction, where the z-direction is into and out of the page in relation to the FIGS. 1-3. The amount by which the elastic substrate 2 can be stretched in any direction is a function of the slack provided relative to that specific direction. In the case of y-direction stretching as applied to the exemplary metal wire waveform shown in FIG. 1, the metal wire 2 does not straighten toward a single straight line as with stretching in the x-direction. Instead, stretching in the y-direction compresses the metal wire 2 along the x-direction, moving the peaks and valleys of the meal wire waveform toward each other in the x-direction.

It is understood that simultaneous stretching in multiple directions results in reducing the maximum stretchable limit in any one direction.

Figure 5:
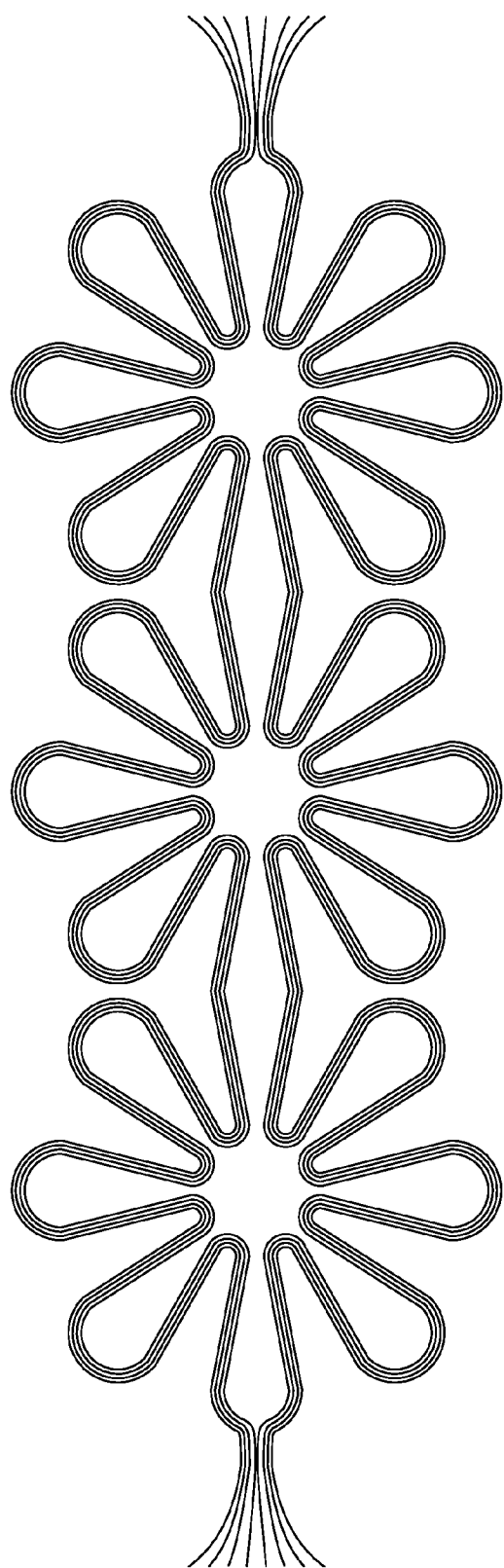
FIG. 5 illustrates the metal wire configuration of FIG. 4B in finer detail.

In the exemplary configuration shown in FIG. 1, the metal wire 4 has a sinusoidal waveform. In alternative embodiments, the metal wire can be configured to have other forms or patterns. FIG. 1 also shows the stretchable metal wire assembly having a single metal wire. In alternative embodiments, the stretchable metal wire assembly can include multiple metal wires, each electrically isolated from each other. FIGS. 4A-4H illustrate exemplary alternative metal wire configurations. Each configuration provides varying amounts of stretchability in the x, y and z-directions. All but FIG. 4G include configurations having multiple metal wires. Although the configurations having multiple metal wires appear to converge to a single wire in the middle section, this is simply due to the scale shown in FIGS. 4A-4F and 4H. Although not detailed in FIGS. 4A-4F and 4H, the multiple metal wires are separate and electrically isolated from each other. FIG. 5 illustrates the metal wire configuration of FIG. 4B in finer detail. As shown in FIG. 5, each of the eight individual metal wires are separate and electrically isolated from each other. The number of metal wires, the pattern for stretchability, and the distance between adjacent metal wires is based on application requirements.

Figure 6:
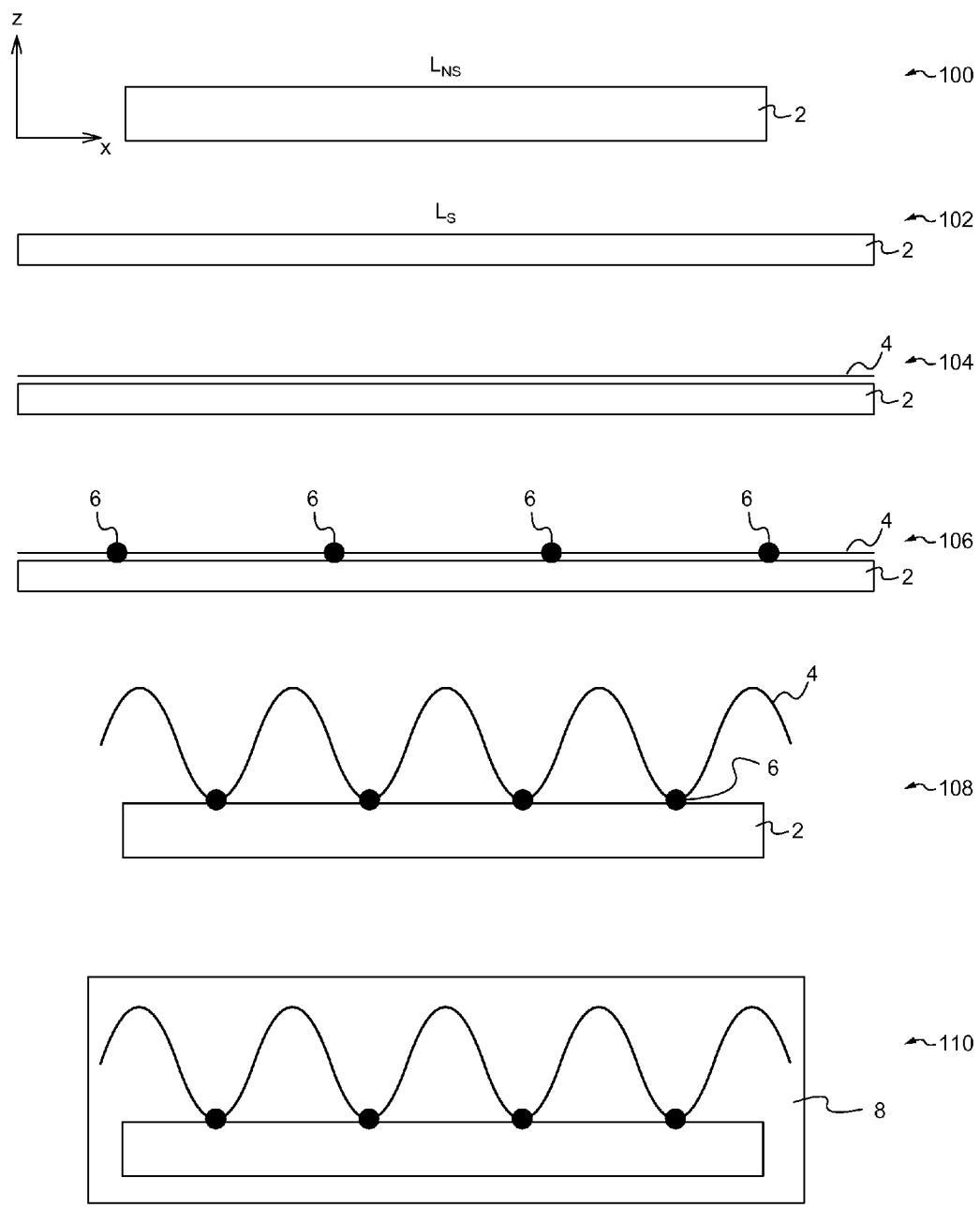
FIG. 6 illustrates a method of fabricating a stretchable metal wire assembly according to an embodiment.

In some embodiments, the metal wire is a small diameter wire separately applied to the elastic substrate. FIG. 6 illustrates a method of fabricating a stretchable metal wire assembly according to an embodiment. At a step 100, the elastic substrate 2 is selected. At the step 102, the elastic substrate is stretched. In some embodiments, a tool is used to grip each end of the elastic substrate, pull the ends apart to stretch the elastic substrate to a desired stretched length, and to hold the elastic substrate in the stretched state.

At the step 104, the metal wire 4 is positioned on the stretched elastic substrate 2. In some embodiments, the metal wire is made of one or more of gold, silver, copper, nickel, their alloys, and any other material used in conventional wire bonding. In some embodiments, the metal wire 4 is configured as a straight line when placed on the stretched elastic substrate 2. In this case, the stretched elastic substrate has a stretched length LS that is equal to the maximum stretched length. In some embodiments, more than one metal wire 4 is positioned on the stretched elastic substrate, where each metal wire is electrically isolated from other metal wires.

At the step 106, the metal wire 4 is secured to the stretched elastic substrate 2. In some embodiments, the metal wire 4 is adhered to the stretched elastic substrate 2 at multiple adhesion joints 6. An adhesive such as silicone adhesive or epoxy-based adhesive can be used. The distance between adhesion joints is application and materials specific. The adhesive is then cured, either at room temperature, elevated temperature or using ultraviolet light, depending on the type of adhesive used. In some embodiments, the metal wire 4 is pre-coated with polymer, such as silicone or urethane, or other adhesive material to promote adhesion between the metal wire and the elastic substrate, and to prevent shorting between neighboring metal wires in a multiple wire configuration.

At the step 108, the stretched elastic substrate 2 is released and returns to its relaxed, non-stretched state. The contracting force of the elastic substrate 2 shapes the metal wire 4 into a tortuous path. In some embodiments, the shape of the tortuous path is formed by the specific placement of the adhesion joints 6 and/or by the elastic characteristics of the elastic substrate 2. In the exemplary configuration shown in FIG. 6, the metal wire 4 forms a tortuous path in the x-z plane, whereas in the exemplary configuration shown in FIG. 1 the metal wire 4 forms a tortuous path in the x-y plane. In general, the metal wire 4 can form a tortuous path in any two or three-dimensional space that includes at least a portion of the elastic substrate 2.

At the step 110, a mold layer 8 is applied over the elastic substrate 2 and metal wire 4. The mold layer 8 is an elastic material, which can be the same or different material than that of the elastic substrate 2.

In other embodiments, the metal wire is not a separate element attached to the elastic substrate, but instead the metal wire is formed as a conductive ink printed onto the non-stretched elastic substrate, such as by inkjet printers or screen printing. The conductive ink is printed in any desired pattern, such as those shown in FIGS. 4A-4H. Once the metal wire is printed onto the elastic substrate, a mold layer is applied as in the step 110 above.

In other embodiments, the metal wire can be woven into the stretched or non-stretched elastic substrate, with or without subsequent adhesion joints being applied. In still other embodiments, a channel can be formed in the elastic substrate such that in the non-stretched state the channel forms the desired tortuous path pattern. The metal wire can be positioned in the channel while the elastic substrate is either stretched or non-stretched. Adhesive can be subsequently applied to secure the metal wire in the channel, followed by a mold layer.

Figure 7:
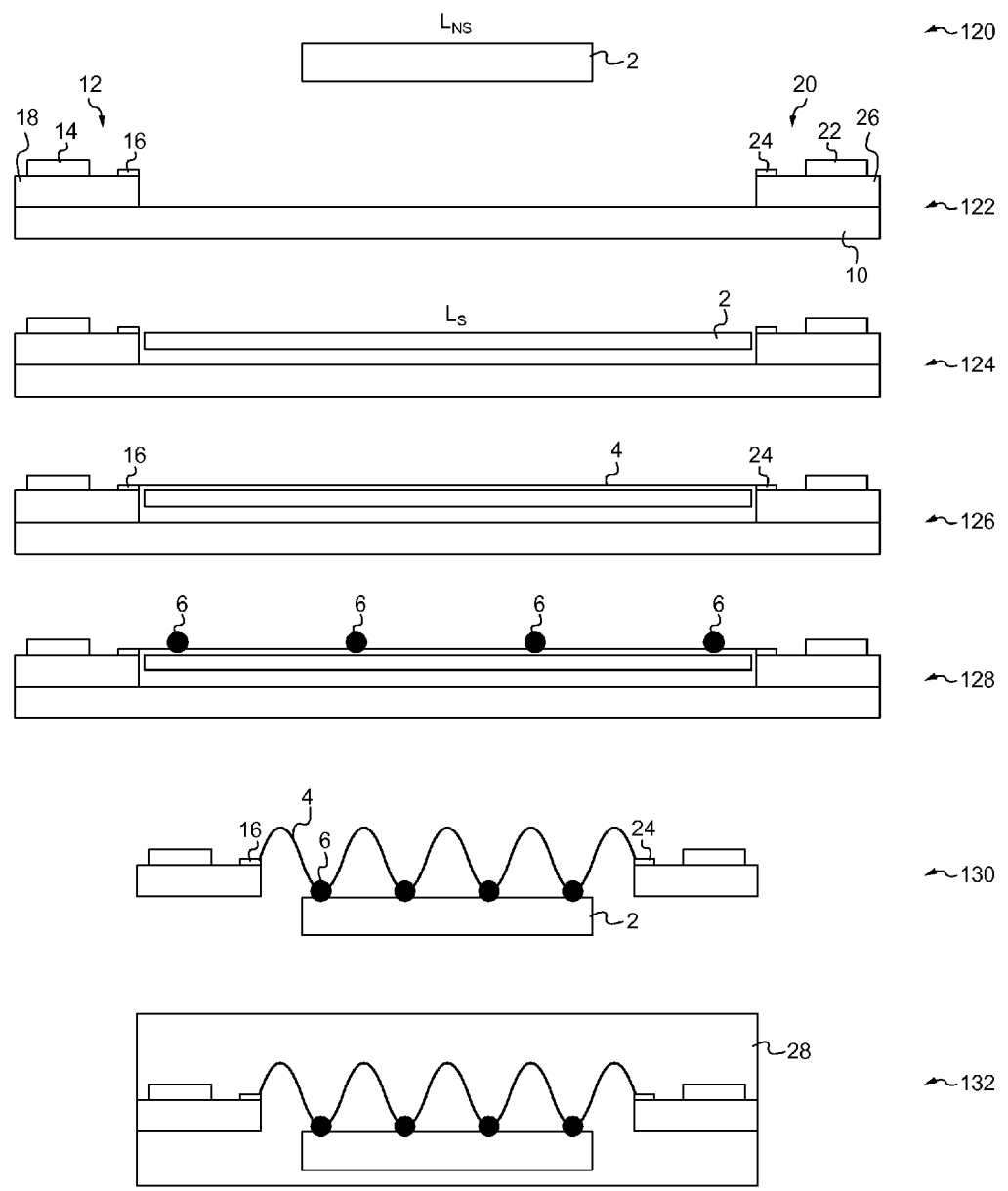
FIG. 7 illustrates a method of fabricating a stretchable metal wire assembly according to another embodiment.

The stretchable meal wire assembly can also include additional components, such as electrical interconnect components, or simply interconnect components, coupled to the end of each metal wire. FIG. 7 illustrates a method of fabricating a stretchable metal wire assembly according to another embodiment. At a step 120, the elastic substrate 2 is selected. At the step 122, one or more components are temporarily coupled to a carrier substrate 10. The carrier substrate 10 is configured such that the components can be placed, temporarily held in position and subsequently removed from the carrier substrate. In some embodiments, there is one component to be coupled to each end of each metal wire 4. In some embodiments, each component is a printed circuit board assembly (PCBA) or packaged electronic device. In the exemplary configuration shown in FIG. 7, a PCBA 12 and a PCBA 18 are coupled to the carrier substrate 10. The PCBA 12 includes at least one electronic component 14 and at least one metal pad 16 coupled to a printed circuit board (PCB) 18. The PCBA 20 includes at least one electronic component 22 and at least one metal pad 24 coupled to a PCB 26.

At the step 124, the elastic substrate 2 is positioned between the PCBA 12 and the PCBA 20, and the elastic substrate is stretched. The elastic substrate 2 can be positioned on the carrier substrate 10 or can be suspended above the carrier substrate 10. In some embodiments, a tool is used to grip each end of the elastic substrate, pull the ends apart to stretch the elastic substrate to a desired stretched length, and to hold the elastic substrate in the stretched state.

At the step 126, the metal wire 4 is positioned on the stretched elastic substrate 2. In some embodiments, the metal wire 4 is configured as a straight line when placed on the stretched elastic substrate 2. In this case, the stretched elastic substrate has a stretched length LS that is equal to the maximum stretched length. A first end of the metal wire 4 is coupled to the metal pad 16 on the PCBA 12 and a second end of the metal wire 4 is coupled to the metal pad 24 on the PCBA 20. The metal wire ends can be coupled to the metal pads using any conventional means that enable electrical connectivity including, but not limited to, soldering, welding or conducting adhesives. In some embodiments, more than one metal wire 4 is positioned on the stretched elastic substrate, where each metal wire is electrically isolated from other metal wires. In this case, each of the PCBAs 12 and 20 can be configured with additional metal pads, one metal pad to be coupled to one end of one of the metal wires. Alternatively, additional PCBAs can be added where the multiple metal wires can be coupled in any combination of one or more metal wires to one or more PCBAs.

At the step 128, the metal wire 4 is secured to the stretched elastic substrate 4. In some embodiments, the metal wire 4 is adhered to the stretched elastic substrate 2 at multiple adhesion joints 6. In some embodiments, the metal wire 4 is pre-coated with polymer to promote adhesion between the metal wire and the elastic substrate, and to prevent shorting between neighboring metal wires in a multiple wire configuration.

At the step 130, the carrier substrate 10 is removed. The stretched elastic substrate 2 is released and returns to its relaxed, non-stretched state. The contracting force of the elastic substrate 2 shapes the metal wire 4 into a tortuous path. In some embodiments, the shape of the tortuous path is formed by the specific placement of the adhesion joints 6 and/or by the elastic characteristics of the elastic substrate 2. The metal wire 4 can form a tortuous path in any two or three-dimensional space. It is understood that the tortuous path can be formed using any of the previously described methods including, but not limited to, weaving the metal wire into the stretched or non-stretched elastic substrate, forming channels in the elastic substrate and positioning the metal wire within the channel, or printing conductive ink onto the elastic substrate to form the metal wire.

At the step 132, a mold layer 28 is applied over the elastic substrate 2, the metal wire 4, the PCBA 12 and the PCBA 20. The mold layer 28 is an elastic material, which can be the same or different material than that of the elastic substrate 2. In some embodiments, an electrical interface to one or both electrical interconnect components is left exposed so as to provide an external electrical connectivity. Such an interface can include, but is not limited to, a metal pad, a metal wire coming off the electrical interconnect component or an interface plug that is part of the electrical interconnect component.

Coaxial Cable Embodiment

Figure 8:
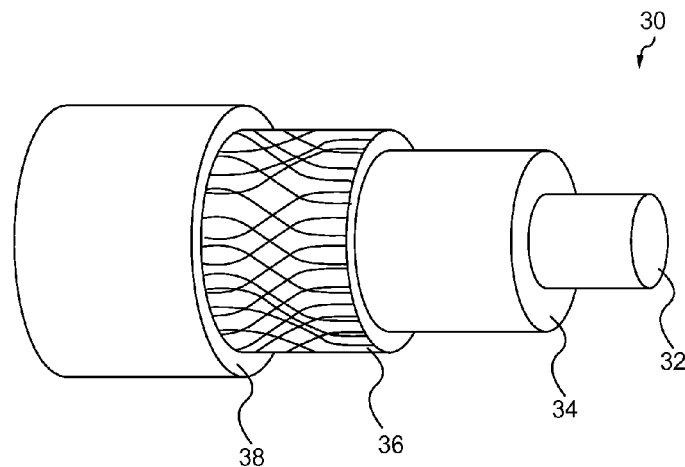
FIG. 8 illustrates an exemplary configuration of a coaxial cable.

In some embodiments, the metal wire in the stretchable metal wire assembly is replaced with a coaxial cable, thereby forming a stretchable coaxial cable assembly. The coaxial cable can be of any conventional size, including the sub-millimeter range such as 0.5 mm diameter or 0.2 mm diameter, to enable device miniaturization. A coaxial cable includes an inner conductor surrounded by an insulating layer, surrounded by a conducting shield. FIG. 8 illustrates an exemplary configuration of a coaxial cable. The coaxial cable 30 includes an inner conductor 32, an insulation layer 34 surrounding the inner conductor 32, a conducting shield 36 surrounding the insulation layer 34, and an outer insulation layer 38 surrounding the conducting shield 36. The inner conductor 32 can be a conducting metal, such as copper, or a conducting metal plated with another metal, such as silver plated copper. The insulation layer 34 can be a polymer, such as a polytetrafluoroethylene, for example Teflon™. The conducting shield 36 can be a metal mesh, such as a copper mesh, a metal plated on the insulation layer 34, such as copper or tin solder, or a metal coated polymer, such as aluminized polyester. The outer insulation layer 38 can be a polymer, such as polyester. Use of the conducting shield electrical performance by eliminating the interference from nearby wires due to mutual inductance. Use of the insulation layer improves electrical performance by reducing self-conductance.

The coaxial cable can be coupled to an elastic substrate such that the coaxial cable has a tortuous path relative to the elastic substrate in the non-stretched state. The coaxial cable can be pre-coated with polymer or adhesion promoter to promote adhesion between the coaxial cable and the elastic substrate. The coaxial cable can be formed in the tortuous path in a manner similar to that described above in relation to the stretchable metal wire assembly. Alternatively, the coaxial cable can be formed into the tortuous path using a pre-heating treatment or other forming means, then attached to the elastic substrate. A subsequent mold layer can then be applied to the formed coaxial cable and elastic substrate. In other embodiments, the coaxial cable is pre-formed into the tortuous path using the pre-heating treatment or other forming means, and then an elastic substrate such as an elastic mold layer is applied over the formed coaxial cable. It is understood that the stretchable coaxial cable assembly can include more than one coaxial cable.

Figure 9:
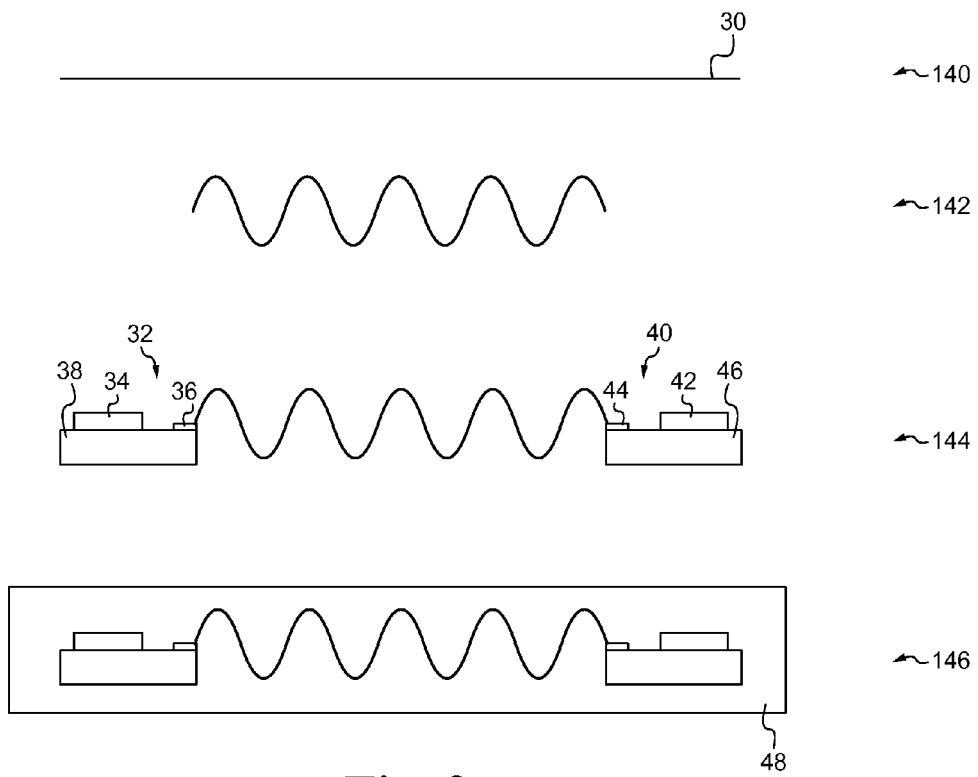
FIG. 9 illustrates a method of fabricating a stretchable coaxial cable interconnect according to an embodiment.

The stretchable coaxial cable assembly can also include additional components coupled to the end of each coaxial cable to form a stretchable coaxial cable interconnect. FIG. 9 illustrates a method of fabricating a stretchable coaxial cable interconnect according to an embodiment. At a step 140, the coaxial cable 30 is selected. At the step 142, the coaxial cable 30 is formed into the desired tortuous path, or waveform. In some embodiments, a pre-heat treatment is used to form the coaxial cable 30 into the tortuous path. At the step 144, a first end of the inner conductor 32 of the coaxial cable 30 is coupled to a first interconnect component 32 and a second end of the inner conductor 32 is coupled to a second interconnect component 40. In some embodiments, the first interconnect component 32 is a PCBA having at least one electronic component 34 and at least one metal pad 36 coupled to a PCB 38, and the second interconnect component 40 is a PCBA having at least one electronic component 42 and at least one metal pad 44 coupled to a PCB 46. The first end of the inner conductor 32 is coupled to the metal pad 36, and the second end of the inner conductor 32 is coupled to the metal pad 44. The inner conductor ends can be coupled to the metal pads using any conventional means that enable electrical connectivity including, but not limited to, soldering, welding or conducting adhesives. In some embodiments, the PCBAs are temporarily held in position using a carrier substrate, such as the carrier substrate 10 in FIG. 7.

In some embodiments, more than one coaxial cable 30 is used. In this case, each of the PCBAs 32 and 40 can be configured with additional metal pads, one metal pad to be coupled to one end of one of the coaxial cables. Alternatively, additional PCBAs can be added where the multiple coaxial cables can be coupled in any combination of one or more coaxial cable ends to one or more PCBAs.

At the step 146, a mold layer 48 is applied over the coaxial cable 30, the PCBA 32 and the PCBA 40. The mold layer 48 is an elastic material.

Figure 10:
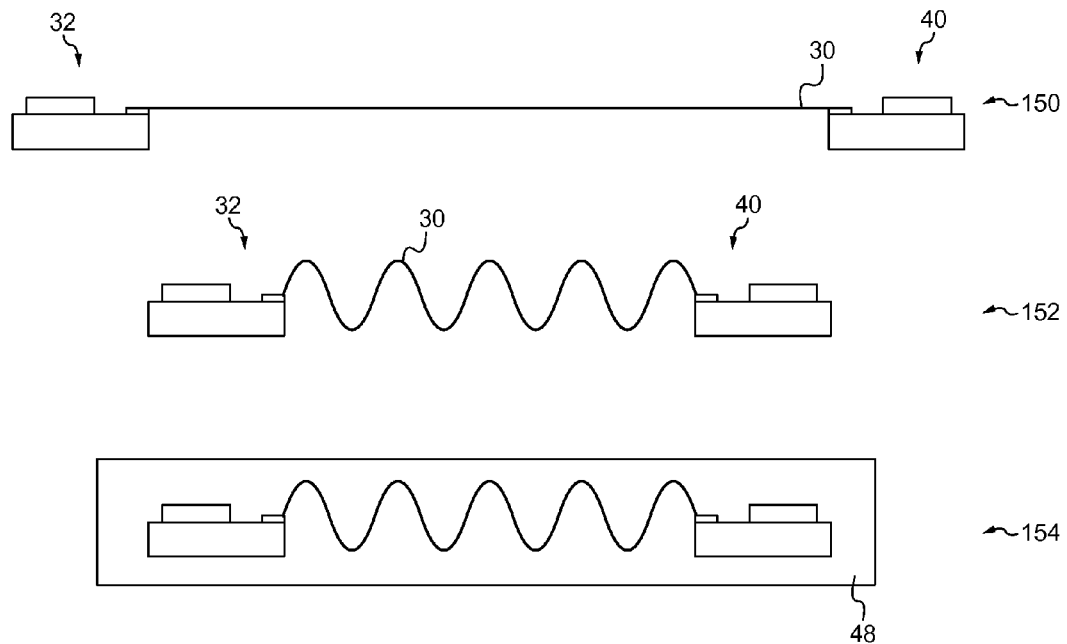
FIG. 10 illustrates a method of fabricating a stretchable coaxial cable interconnect according to another embodiment.

FIG. 10 illustrates a method of fabricating a stretchable coaxial cable interconnect according to another embodiment. The method of FIG. 10 is similar to the method of FIG. 9 except that the method of FIG. 10 couples the coaxial cable to the interconnect components prior to forming the coaxial cable into the tortuous path. At a step 150, the coaxial cable 30 is selected, the first end of the inner conductor 32 of the coaxial cable 30 is coupled to the first interconnect component 32 and the second end of the inner conductor 32 is coupled to the second interconnect component 40. In some embodiments, the PCBAs are temporarily held in position using a carrier substrate, such as the carrier substrate 10 in FIG. 7.

At the step 152, the coaxial cable 30 is formed into the desired tortuous path, or waveform. In some embodiments, a pre-heat treatment is used to form the coaxial cable 30 into the tortuous path.

In some embodiments, more than one coaxial cable 30 is used. In this case, each of the PCBAs 32 and 40 can be configured with additional metal pads, one metal pad to be coupled to one end of one of the coaxial cables. Alternatively, additional PCBAs can be added where the multiple coaxial cables can be coupled in any combination of one or more coaxial cables to one or more PCBAs.

At the step 154, the mold layer 48 is applied over the coaxial cable 30, the PCBA 32 and the PCBA 40.

In some embodiments, an electrical interface to one or both electrical interconnect components of the stretchable coaxial cable interconnect embodiments is left exposed so as to provide an external electrical connectivity. Such an interface can include, but is not limited to, a metal pad, a metal wire coming off the electrical interconnect component or an interface plug that is part of the electrical interconnect component.

Metal Spring Embodiment

In some embodiments, the metal wire in the stretchable metal wire assembly is replaced with a metal spring, thereby forming a stretchable metal spring assembly. The metal spring is a coiled metal wire. The metal spring can be of any conventional size. For miniature devices, a metal spring having a small diameter wire is used, such as a metal wire having about a 10 mm diameter. For further miniaturization, the metal wire can be coiled in a small diameter, such as a coil having an outer diameter of about 0.1 mm. The metal wire used in the metal spring can be of the same type of electrically conducting material described in regard to the metal wire described in previous embodiments.

Figure 11:
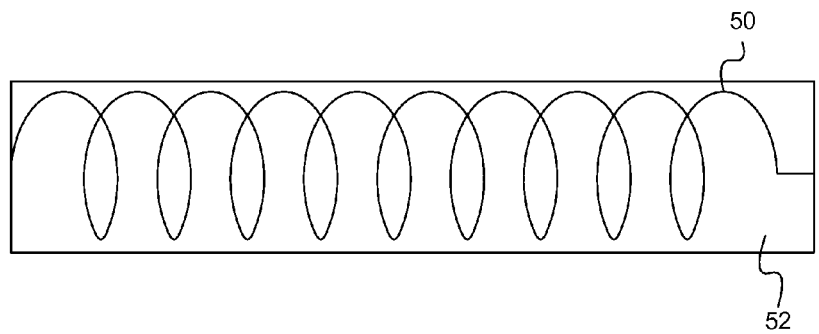
FIG. 11 illustrates a stretchable metal spring assembly according to an embodiment.

The metal spring can be coiled to form the metal spring using any conventional means for forming a spring. The coiled path of the metal wire in the metal spring is an exemplary configuration of the more general tortuous path described above. FIG. 11 illustrates a stretchable metal spring assembly according to an embodiment. The stretchable metal spring assembly includes a metal spring 50 and an elastic substrate 52. In some embodiments, the metal spring is coupled to an elastic substrate such that a relaxed state of the metal spring corresponds to a non-stretched state of the elastic substrate. The metal spring can be pre-coated with polymer or adhesion promoter to promote adhesion between the metal spring and the elastic substrate. The metal spring can be coupled to the elastic substrate in a manner similar to that described above in relation to the stretchable metal wire assembly. For example, the metal spring can be adhered to the elastic substrate at select adhesion points. Alternatively, the metal spring can be woven into the elastic substrate, with or without subsequent adhesion joints being applied. Still alternatively, channels can be formed in the elastic substrate such that each channel is aligned with a portion of the metal spring, such as the bottom portion of each coiled loop. Since the metal spring is a three-dimensional structure, a portion of the metal spring rests in a corresponding channel portion. Adhesive can be subsequently applied to secure the metal spring in the channels, followed by an elastic mold layer. In other embodiments, the metal spring is not adhered to the elastic substrate, but instead is embedded or encapsulated within the elastic substrate, such as within an elastic mold layer. It is understood that the stretchable metal spring assembly can include more than one metal spring. In some embodiments, instead of coiling a metal wire to form the metal spring, a coaxial cable can be coiled to form the metal spring.

Figure 12:
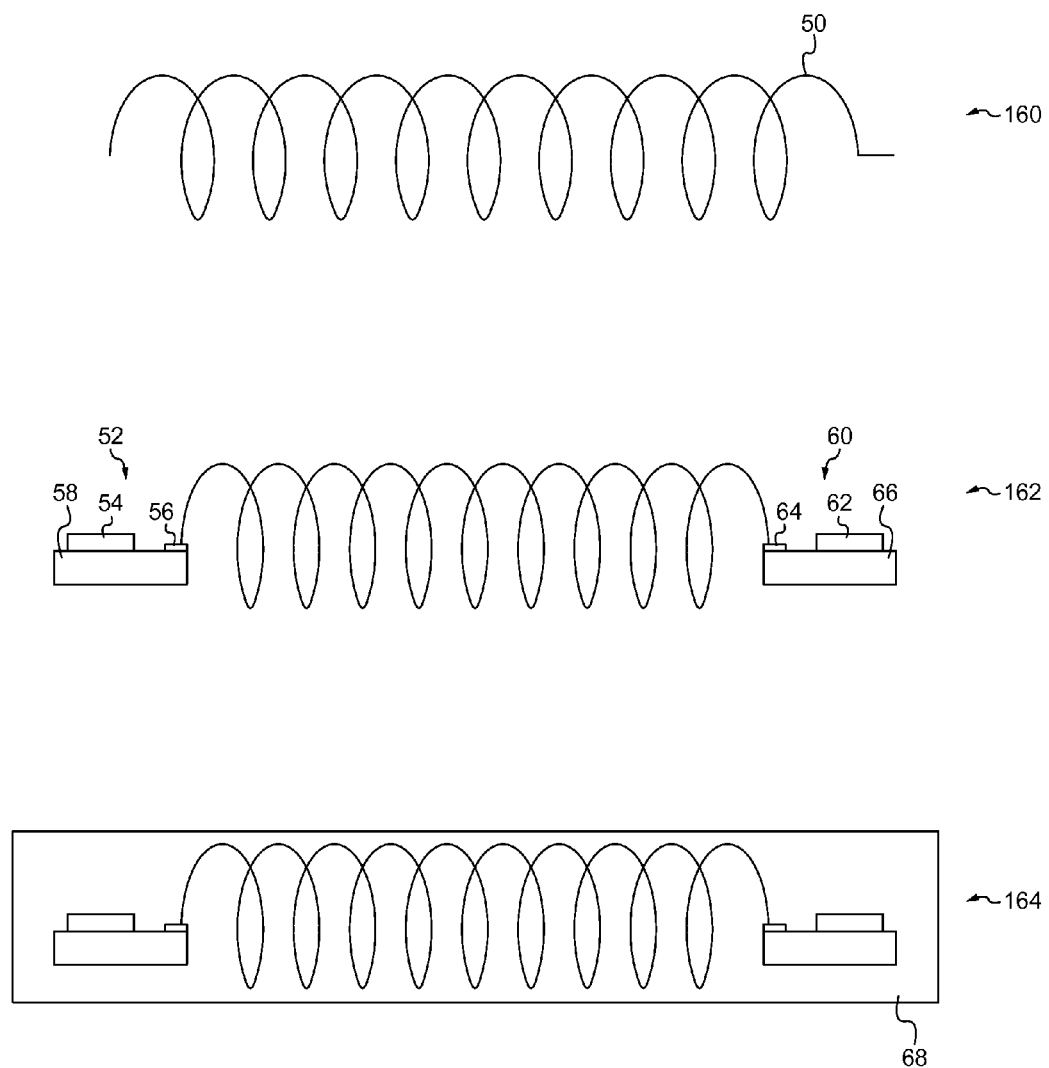
FIG. 12 illustrates a method of fabricating a stretchable metal spring interconnect according to an embodiment.

The stretchable metal spring assembly can also include additional components coupled to the end of each metal spring to form a stretchable metal spring interconnect. FIG. 12 illustrates a method of fabricating a stretchable metal spring interconnect according to an embodiment. At a step 160, the metal spring 50 is selected. Characteristics of the metal spring such as form factor, spring tension, electrical performance and the like are selected according to application. In some embodiments, the metal spring is treated with adhesion promoter. At the step 162, a first end of the metal spring 50 is coupled to a first interconnect component 52 and a second end of the metal spring 50 is coupled to a second interconnect component 60. In some embodiments, the first interconnect component 52 is a PCBA having at least one electronic component 54 and at least one metal pad 56 coupled to a PCB 58, and the second interconnect component 60 is a PCBA having at least one electronic component 62 and at least one metal pad 64 coupled to a PCB 66. The first end of the metal spring 50 is coupled to the metal pad 56, and the second end of the metal spring 50 is coupled to the metal pad 64. The metal spring ends can be coupled to the metal pads using any conventional means that enable electrical connectivity including, but not limited to, soldering, welding or conducting adhesives. In some embodiments, the PCBAs are temporarily held in position using a carrier substrate, such as the carrier substrate 10 in FIG. 7.

In some embodiments, more than one metal spring 50 is used. In this case, each of the PCBAs 52 and 60 can be configured with additional metal pads, one metal pad to be coupled to one end of one of the metal springs. Alternatively, additional PCBAs can be added where the multiple metal springs can be coupled in any combination of one or more metal spring ends to one or more PCBAs.

At the step 164, a mold layer 68 is applied over the metal spring 50, the PCBA 52 and the PCBA 60. The mold layer 68 is an elastic material. In some embodiments, the mold layer 68 is applied through three dimensional printing where liquid mold material, such as liquid silicone, is deposited on the metal spring and the PCBA layer by layer. In other embodiments, the mold layer 68 is applied through injection molding. In this case, a mold tool is used.

Figure 13:
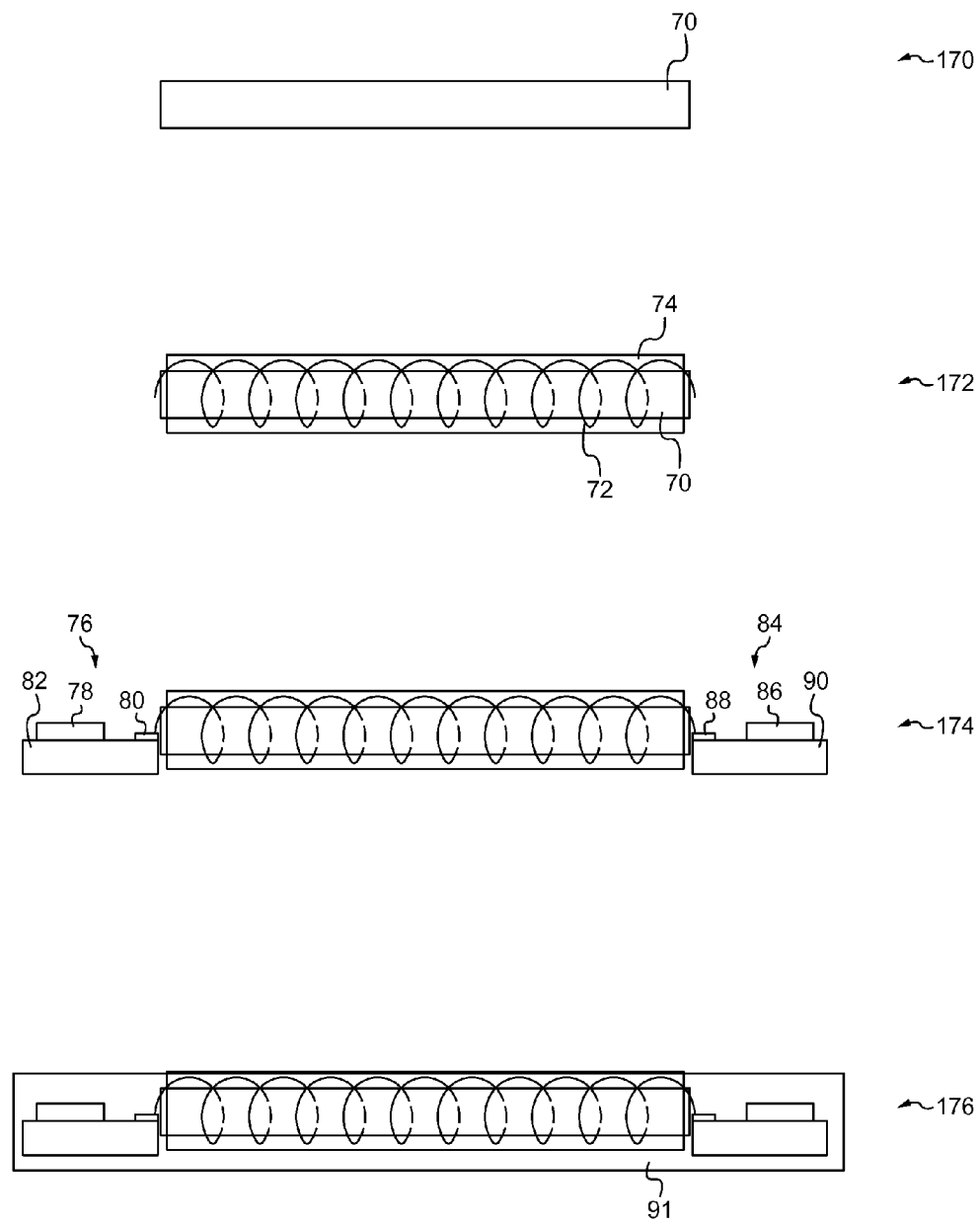
FIG. 13 illustrates a method of fabricating a stretchable metal spring interconnect according to another embodiment.

FIG. 13 illustrates a method of fabricating a stretchable metal spring interconnect according to another embodiment. The method of FIG. 13 is similar to the method of FIG. 12 except that the metal spring is formed differently in the method of FIG. 13. At a step 170, an elastic wire 70 is formed. In some embodiments, the elastic wire 70 is made of silicone or polyurethane. At the step 172, a selected metal wire 72 is coiled around the elastic wire to form a metal spring. The number of turns, distance between turns, and other form factors and characteristics of the formed metal spring are application specific. An elastic jacket 74 is then formed over the metal spring 72 and elastic wire 70. The elastic jacket 74 can be of the same or different material than the elastic wire 70. In some embodiments, the metal wire 72 is coated with an elastic material, then plated with a metal for shielding, then coated with the elastic jacket 74.

At the step 174, a first end of the metal spring 72 is coupled to a first interconnect component 76 and a second end of the metal spring 72 is coupled to a second interconnect component 84. In some embodiments, the first interconnect component 76 is a PCBA having at least one electronic component 78 and at least one metal pad 80 coupled to a PCB 82, and the second interconnect component 84 is a PCBA having at least one electronic component 86 and at least one metal pad 88 coupled to a PCB 90. The first end of the metal spring 72 is coupled to the metal pad 80, and the second end of the metal spring 72 is coupled to the metal pad 88. The metal spring ends can be coupled to the metal pads using any conventional means that enable electrical connectivity including, but not limited to, soldering, welding or conducting adhesives. In some embodiments, the PCBAs are temporarily held in position using a carrier substrate, such as the carrier substrate 10 in FIG. 7.

In some embodiments, more than one metal spring 72 is formed and used. In this case, each of the PCBAs 76 and 84 can be configured with additional metal pads, one metal pad to be coupled to one end of one of the metal springs. Alternatively, additional PCBAs can be added where the multiple metal springs can be coupled in any combination of one or more metal spring ends to one or more PCBAs.

At the step 176, a mold layer 91 is applied over the elastic jacket 74, the metal spring 72, the elastic wire 70, the PCBA 76 and the PCBA 84. The mold layer 91 is an elastic material. The elastic material used for the mold layer 91 can be the same or different than the elastic material used for the elastic wire 70. In some embodiments, the mold layer 91 is applied through three dimensional printing. In other embodiments, the mold layer 91 is applied through injection molding. In this case, a mold tool is used.

In some embodiments, an electrical interface to one or both electrical interconnect components of the stretchable metal spring interconnect embodiments is left exposed so as to provide an external electrical connectivity. Such an interface can include, but is not limited to, a metal pad, a metal wire coming off the electrical interconnect component or an interface plug that is part of the electrical interconnect component.

Elastomer Tube Embodiment

In some embodiments, the metal wire is positioned within a tube made of elastic material, referred to as an elastic tube. The elastic tube can be made of the elastic materials previously described. The metal wire is configured to have a tortuous path within the elastic tube while the elastic tube is in a relaxed, or non-stretched state. The elastic tube has an inner diameter larger than the diameter of the metal wire allowing the metal wire to bend within the elastic tube and the tortuous path to be formed. Any sized metal wires can be used, and correspondingly larger-sized elastic tubes. In some embodiments, small diameter metal wires, such as those sizes used in conventional wire bonding applications, are used for device miniaturization. The metal wire can be made of any electrically conducting type of material including, but not limited to, gold, silver, nickel, their alloys, or combinations thereof. In some embodiments, the metal wire is selectively secured to the inner wall of the elastic tube at one or more adhesion joints. In some embodiments, the metal wire is pre-coated with polymer, such as silicone or urethane, to promote adhesion between the metal wire and the inner surface of the elastic tube. In some embodiments, the elastic tube with metal wire is coupled to an elastic substrate of the type previously described. The elastic tube with metal wire can be coupled to the elastic substrate using conventional methods including, but not limited to, any similar method as coupling the metal wire to the elastic substrate described in previous embodiments. The elastic tube can be aligned in a straight line when coupled to the elastic substrate, or alternatively the elastic tube can be configured having a tortuous path. More than one elastic tube with metal wire can be coupled to the elastic substrate. The elastic tube with metal wire can be a stand-alone stretchable metal wire assembly, or the elastic tube with metal wire coupled to the elastic substrate can be a stretchable metal wire assembly. Either embodiment of the stretchable metal wire assembly can have each end of the metal wire coupled to additional components to form stretchable metal wire interconnects, similar to the various interconnect embodiments previously described.

Figure 14:
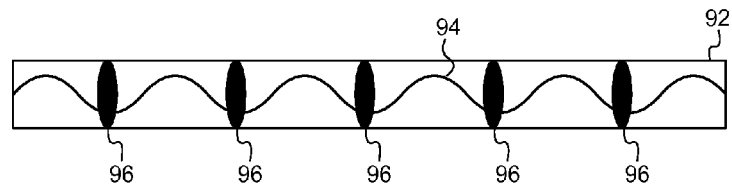
FIG. 14 illustrates a stretchable metal wire assembly configured as an elastic tube having a metal wire according to an embodiment.

FIG. 14 illustrates a stretchable metal wire assembly configured as an elastic tube having a metal wire according to an embodiment. The stretchable metal wire assembly shown in FIG. 14 is in a non-stretched state. The stretchable metal wire assembly includes an elastic tube 92 having a hollow inner core extending lengthwise. A metal wire 94 is positioned within the hollow inner core of the elastic tube 92 and secured in position by one or more adhesion joints 96. The metal wire 94 is configured in the elastic tube 92 such that the metal wire 94 has a tortuous path relative to a central axis of the elastic tube 92 in the non-stretched state. The metal wire 94 can be pre-coated with polymer or adhesion promoter to promote adhesion between the metal wire 94 and the elastic tube 92.

Figure 15:
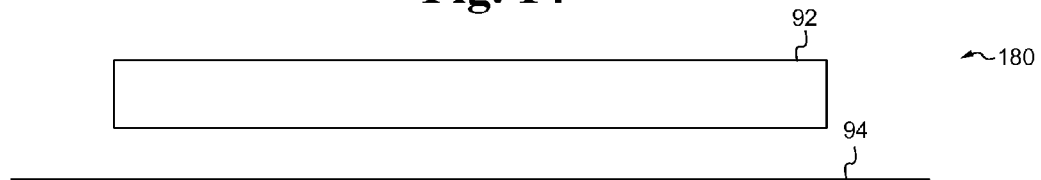
FIG. 15 illustrates a method of fabricating a stretchable metal wire assembly having an elastic tube with metal wire according to an embodiment.
Figure 15:
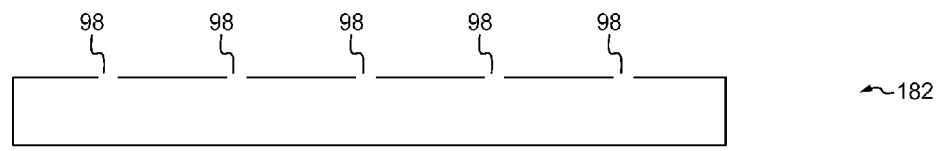
Figure 15:
Figure 15:
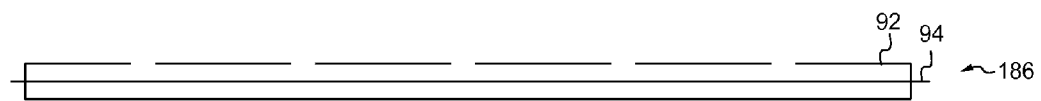
Figure 15:
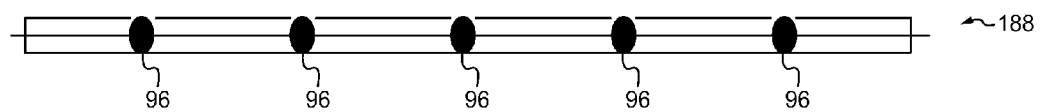
Figure 15:

Various methods can be used to fabricate a stretchable metal wire assembly having an elastic tube with metal wire. FIG. 15 illustrates a method of fabricating a stretchable metal wire assembly having an elastic tube with metal wire according to an embodiment. At a step 180, the elastic tube 92 and the metal wire 94 are selected. At the step 182, holes 98 are formed in the elastic tube 92. The number of holes and the distance between holes is application specific. At the step 184, the elastic tube 92 is stretched. In the embodiment shown in FIG. 15, the holes are formed in the elastic tube while the elastic tube is in the non-stretched state. It is understood that the elastic tube can first be stretched, and then the holes formed in the stretched elastic tube.

At the step 186, the metal wire 94 is inserted in the stretched elastic tube 92. At the step 188, adhesive is dropped into each hole 98. The adhesive is then cured using conventional means such as heating or ultraviolet light. The adhesive forms adhesion joints 96. After the adhesion is cured, at the step 190 the stretched elastic tube 92 is released to its non-stretched state. The force of the elastic tube 92 retracing from the stretched state to the non-stretched state reshapes the metal wire 94 from a straight, or more straight, shape into a tortuous path that is more non-linear than the shape when the elastic tube 92 is in the stretched state. The stretchable metal wire assembly can also include additional components coupled to the end of each metal wire to form a stretchable metal spring interconnect. Such an interconnect can be made using any of the methods previously described.

Figure 16:
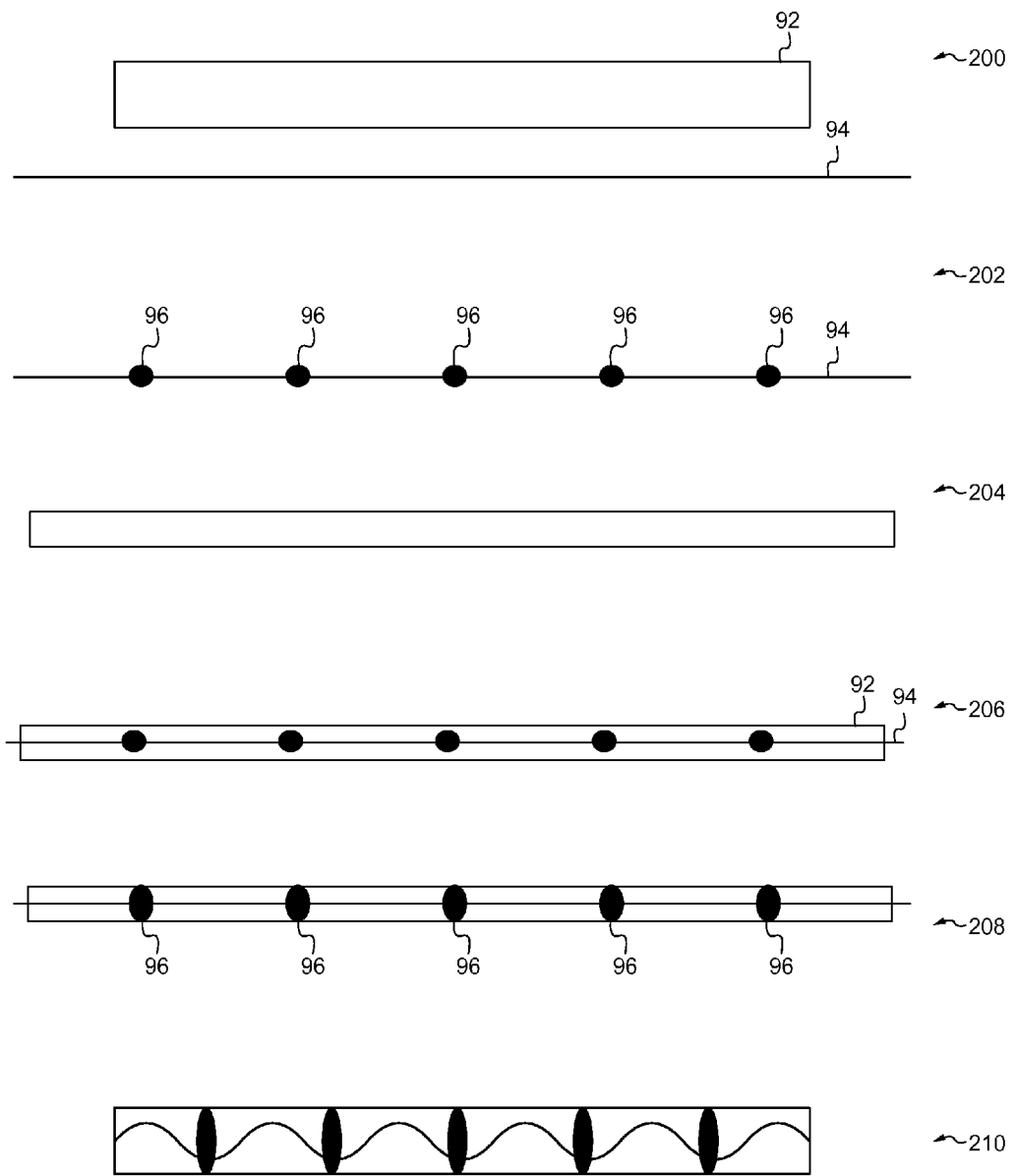
FIG. 16 illustrates a method of fabricating a stretchable metal wire assembly having an elastic tube with metal wire according to another embodiment.

The stretchable metal wire assembly having the elastic tube with metal wire can alternatively be fabricated by applying adhesive to the metal wire prior to inserting the metal wire into the elastic tube. This eliminates the need to form holes in the elastic tube. FIG. 16 illustrates a method of fabricating a stretchable metal wire assembly having an elastic tube with metal wire according to another embodiment. At a step 200, the elastic tube 92 and the metal wire 94 are selected. At the step 202, an adhesive 96 is added to select positions along the metal wire 94. The number of adhesion positions and the distance between positions is application specific. At the step 204, the elastic tube 92 is stretched.

At the step 206, the metal wire 94 with adhesive positions is inserted in the stretched elastic tube 92. It is understood that the step 204 and 206 can be reversed such that the metal wire 94 with adhesive positions is inserted into the non-stretched elastic tube 92 At the step 208, the adhesive is cured using conventional means such as heating or ultraviolet light. In some embodiments, pressure is applied at each adhesion position 96 during the curing process. The adhesive forms adhesion joints 96. After the adhesion is cured, at the step 210 the stretched elastic tube 92 is released to its non-stretched state forming the metal wire into the tortuous path. The stretchable metal wire assembly can also include additional components coupled to the end of each metal wire to form a stretchable metal spring interconnect. Such an interconnect can be made using any of the methods previously described.

In some embodiments, the tortuous path is made by pre-forming the metal wire into the desired waveform prior to inserting the metal wire into the elastic tube. The formed metal wire is then inserted into the elastic tube.

Wire Bonding Embodiment

Figure 17:
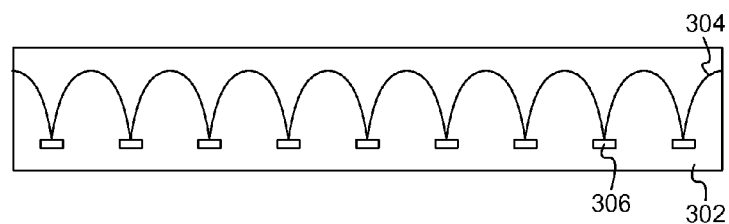
FIG. 17 illustrates a stretchable metal wire assembly including metal pads according to an embodiment.

In some embodiments, wire bonding techniques are used to secure the metal wire to the elastic substrate and to facilitate forming of the tortuous path. Using wire bonding techniques also facilitates inclusion of electronic components within the electrically conductive path. FIG. 17 illustrates a stretchable metal wire assembly including metal pads according to an embodiment. The stretchable metal wire assembly includes an elastic substrate 302. The elastic substrate 302 can be any of the types of elastic substrates previously described. The stretchable metal wire assembly also includes a plurality of metal pads 306 coupled to the elastic substrate 302, and a metal wire 304 coupled to the plurality of metal pads 306. In some embodiments, the metal pads 306 are aligned linearly along a single line in the lengthwise, or y-direction, of the elastic substrate 302. In other embodiments, the metal pads 306 are not aligned linearly along a single line and instead may vary in position in the x-direction, into and out of the page.

The metal wire 304 can be a single wire or multiple wires. The metal wire between adjacent metal pads has a tortuous path when the stretchable metal wire assembly is in a non-stretched state, as shown in FIG. 17. In some embodiments, the metal wire 304 is coupled to the metal pads 306 by wire bonding. In some embodiments, a continuous wire bonding process is used where the metal wire 304 is a single metal wire, the metal wire is wire bonded to a first metal pad, such as the far left metal pad in FIG. 17, then wire bonded to the next adjacent metal pad, and so on. In other embodiments, a sequential wire bonding process is used where the metal wire 304 is multiple separate wires. A first metal wire is wire bonded to the first metal pad and then wire bonded to the next adjacent, or second, metal pad. A second metal wire is wire bonded to the second metal pad and to the next adjacent, or third, metal pad, and so on. In other embodiments, a combination of continuous wire bonding and sequential wire bonding is used. Although labeled as a single element 302 in FIG. 17, the elastic substrate 302 represents either a single elastic substrate into which the metal pads 306 and the metal wires 304 are embedded, or multiple elastic substrates including a first elastic substrate onto which the metal pads 306 are formed and a second substrate such as an elastic mold layer that covers the metal pads 306 and metal wires 304. In some embodiments, the elastic mold layer additionally encapsulates the first elastic substrate. The elastic mold layer can be made of the same or different elastic material as the first elastic substrate.

In some embodiments, the wire bonding is done is such a way that a metal wire loop height, such as an arc, is formed between metal pads to allow for stretching. As shown in the exemplary configuration of FIG. 17, the metal wire 304 forms an arc between each metal pad 306. It is understood that the metal wire can be formed into other waveforms. FIG. 17 shows the metal wire 304 forming a tortuous path in two-dimensions, for example the plane of the page. It is understood that the metal wire can be formed having a tortuous path in the plane perpendicular to the page or in three-dimensions. The wire bonding can be performed using any conventional wire bonding process including, but not limited to, thermocompression, thermosonic or ultrasonic. The metal wire can be made of any of the metal wire types previously described including, but not limited to, gold, silver, copper, nickel, their alloys or any combination thereof.

Figure 18:
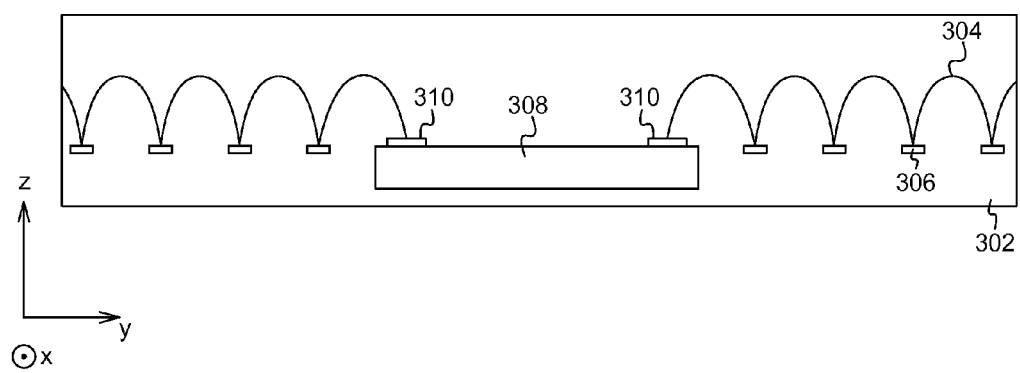
FIG. 18 illustrates a stretchable metal wire assembly including metal pads according to another embodiment.

In some embodiments, the stretchable metal wire assembly including metal pads can have each end of the metal wire, such as the metal wire coming off the metal pad on the far left hand side of FIG. 17 and the metal wire coming off the metal pad on the far right hand side of FIG. 17, coupled to additional components to form stretchable metal wire interconnects, similar to the various interconnect embodiments previously described. One or more additional components can also be added within the series of metal pads. FIG. 18 illustrates a stretchable metal wire assembly including metal pads according to another embodiment. The stretchable metal wire assembly shown in FIG. 18 is similar to that of FIG. 17 with the inclusion of an electronic component 308 positioned in the series of metal pads 306. In some embodiments, the component is a printed circuit board assembly (PCBA) or a packaged electronic device. It is understood that the electronic component 308 can be any type of conventional electronic device having an electrical connection point for electrically coupling to the metal wire 304. In the exemplary configuration shown in FIG. 18, the component 308 includes metal pads 310 for coupling to the metal wires 304.

Figure 19:
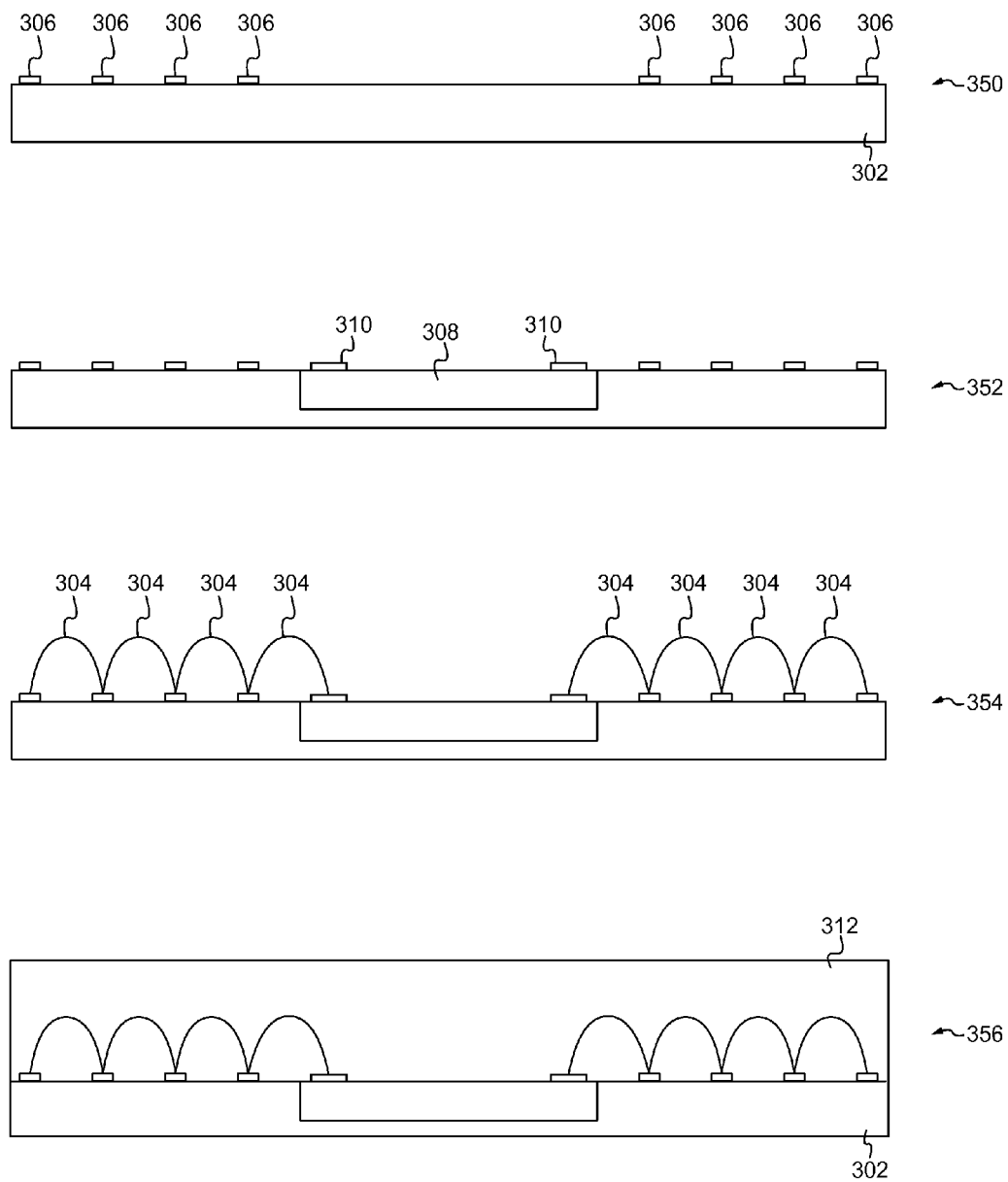
FIG. 19 illustrates a method of fabricating a stretchable metal wire assembly including metal pads according to an embodiment.

Various methods can be used to fabricate a stretchable metal wire assembly including metal pads. FIG. 19 illustrates a method of fabricating a stretchable metal wire assembly including metal pads according to an embodiment. At a step 350, the plurality of metal pads 306 are formed on the elastic substrate 302. In some embodiments, the metal pads are formed using conventional PCB plating processes. For example, a planar metal foil is attached to the elastic substrate, lithograpghy is performed and the metal foil is etched to form the metal pads. In other embodiments, the individual metal pads are printed on the elastic substrate using conductive ink Once cured, the conductive ink is plated using a conventional plating process such as electroplating or electroless plating. In still other embodiments, the individual metal pads can be preformed, such as small squares of metal foil, and a pick and place process positions the preformed metal pads onto the elastic substrate. Regardless of the process used to form the metal pads on the elastic substrate, the metal pads can be secured to the elastic substrate using the adhesive properties of the elastic substrate, or an additional adhesive can be used. The pitch between the metal pads can be designed to allow for maximum wire stretching.

At the step 352, the electronic component 308 is coupled to the elastic substrate 302. The electronic component 308 includes metal pads 310. In some embodiments, a cavity is formed in the elastic substrate 302 for receiving the electronic component 304. Die attach material or other adhesive can be used to enhance adhesion between the electronic component 308 and the elastic substrate 302.

At the step 354, the metal wire 304 is coupled to the metal pads 306 and the metal pads 310. In some embodiments, a wire bonding process is used to bond the metal wire to the metal pads. In some embodiments, a continuous wire bonding process is performed. In other embodiments, a sequential wire bonding process is used. In still other embodiments, a combination of continuous wire bonding and sequential wire bonding is used. In some embodiments, a plasma cleaning step is performed before coupling the metal wire to the metal pads.

At the step 356, a mold layer 312 is applied over the elastic substrate 302, the metal pads 306, the electronic component 308 and the metal wire 304. The mold layer 312 is an elastic material, which can be the same or different material than that of the elastic substrate 302. The elastic substrate 302 can be treated with adhesion promoter to enhance adhesion with the metal pads, the metal wire, the electronic component and/or the mold layer.

Figure 20:
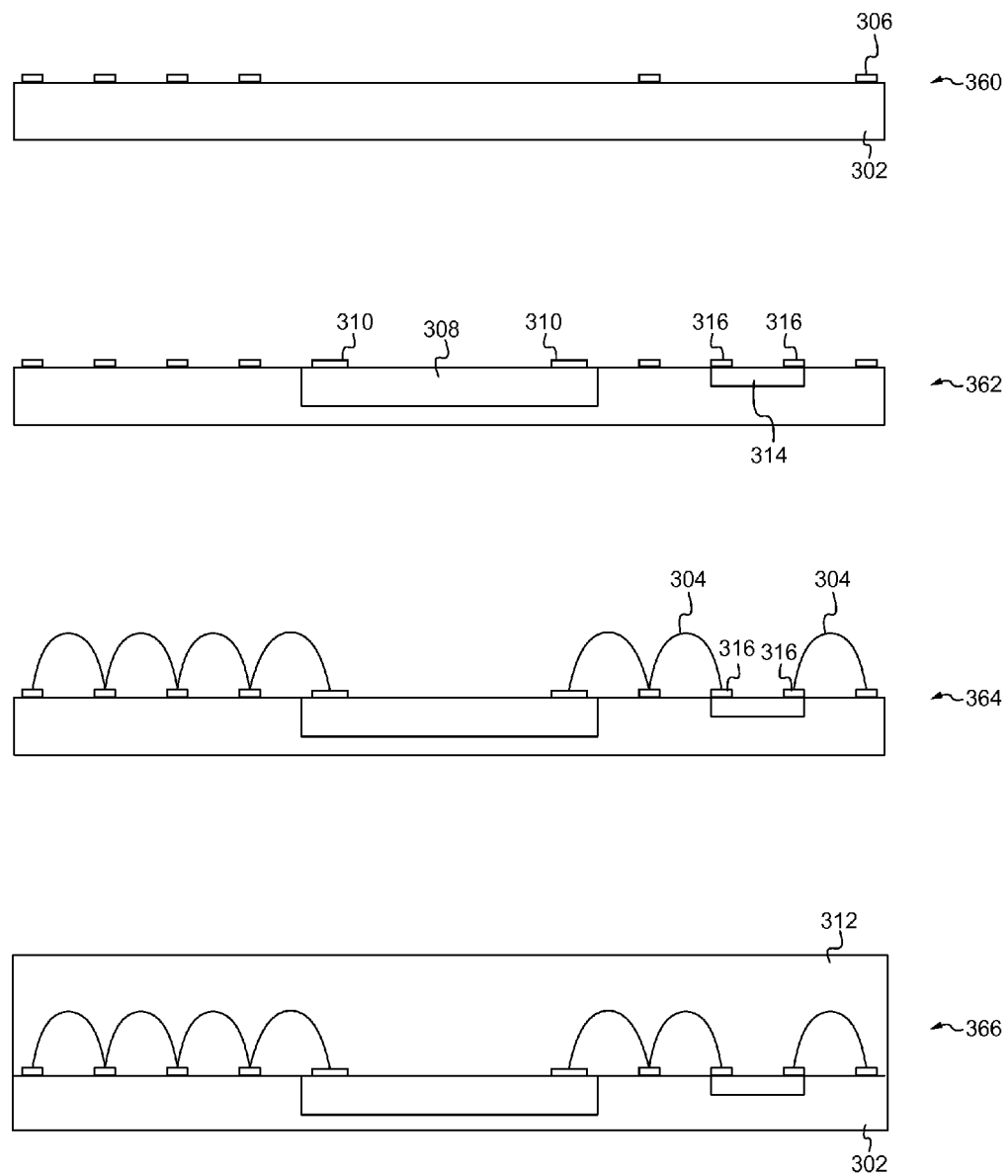
FIG. 20 illustrates a method of fabricating a stretchable metal wire assembly including metal pads according to another embodiment.

The exemplary stretchable metal wire assembly in FIG. 18 includes a single electronic component 308. Alternative embodiments are also contemplated in which more than one electronic component is coupled to the elastic substrate and provided electrical connectivity using the metal pads and the metal wires. FIG. 20 illustrates a method of fabricating a stretchable metal wire assembly including metal pads according to another embodiment. At a step 360, a plurality of metal pads 306 are formed on the elastic substrate 302.

At the step 362, the electronic component 308 is coupled to the elastic substrate 302. Another electronic component 314 is also coupled to the elastic substrate 302. The electronic component 314 includes metal pads 316. In some embodiments, two cavities are formed in the elastic substrate 302 for receiving the electronic component 308 and the electronic component 314. Die attach material or other adhesive can be used to enhance adhesion between the electronic components 308 and 314 and the elastic substrate 302.

At the step 364, the metal wire 304 is coupled to the metal pads 306, the metal pads 310, and the metal pads 316. Similar wire bonding processes as those described in relation to the single electronic component embodiment can be used. In some embodiments, a plasma cleaning step is performed before coupling the metal wire to the metal pads.

At the step 366, the mold layer 312 is applied over the elastic substrate 302, the metal pads 306, the electronic component 308, the electronic component 314 and the metal wire 304.

Figure 21:
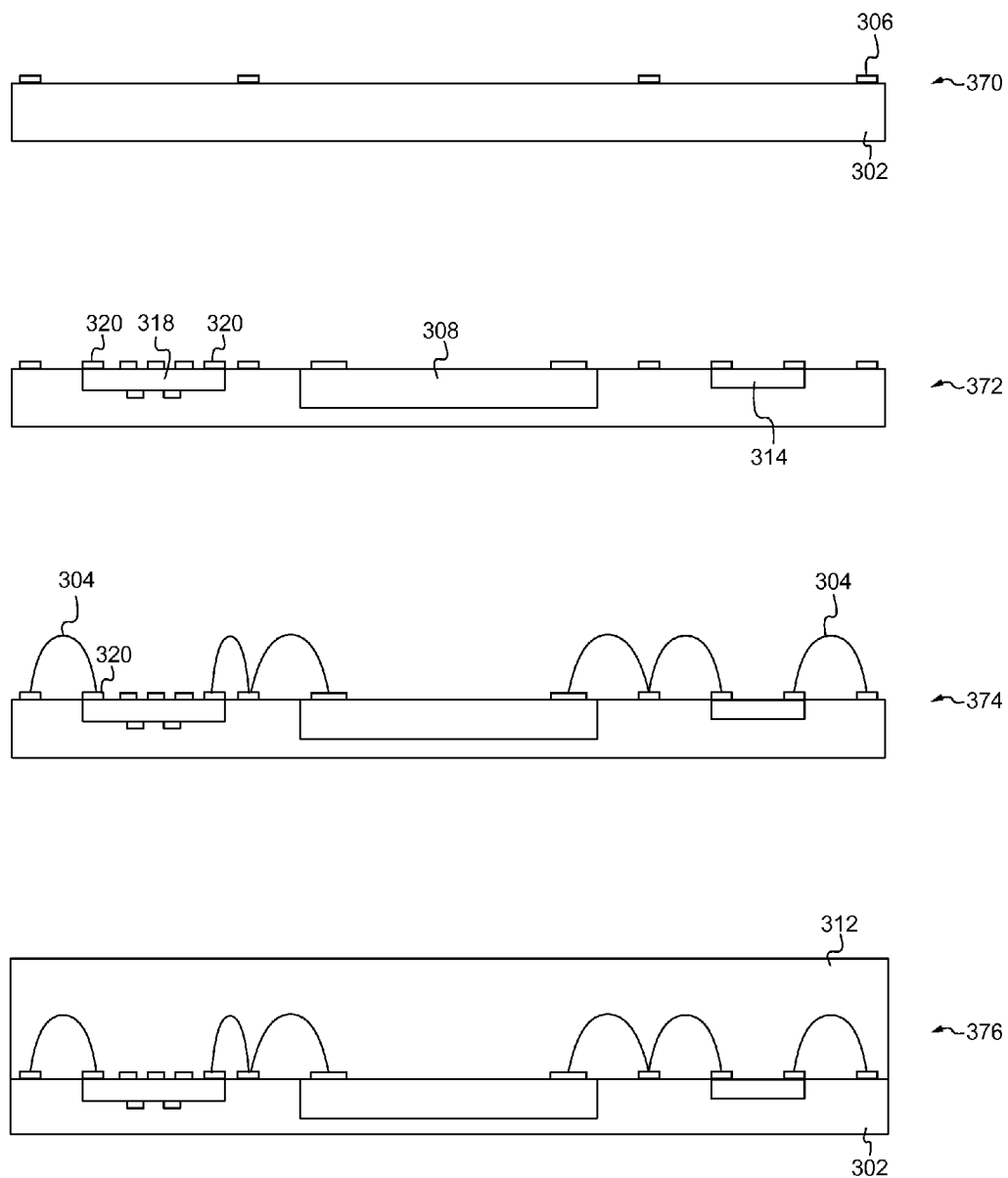
FIG. 21 illustrates a method of fabricating a stretchable metal wire assembly including metal pads according to yet another embodiment.

The electronic components coupled to the elastic substrate can be stand-alone devices having electric interconnects for coupling to the metal wires, or individually packaged devices where the package includes the electrical interconnects. An electronic component can also be considered an element having multiple electronic components integrated as a single component, such as a one-sided or double-sided PCB having multiple electronic components coupled thereto. The electronic components can be either active or passive devices. In the case of a multiple electronic component element, the electronic components can be any combination of active and passive devices. FIG. 21 illustrates a method of fabricating a stretchable metal wire assembly including metal pads according to yet another embodiment. At a step 370, a plurality of metal pads 306 are formed on the elastic substrate 302.

At the step 372, multiple electronic components are coupled to the elastic substrate 302. In this exemplary embodiment, the stretchable metal wire assembly includes three discrete electronic component elements, one of which is a multiple electronic component element 318 having multiple passive devices coupled to a double-sided PCB. The electronic component 314 includes metal pads 320. The electronic component 308 and the electronic component 314 are also coupled to the elastic substrate 302. In some embodiments, cavities are formed in the elastic substrate 302 for receiving each of the electronic component 308, the electronic component 314 and the electronic component 318. Die attach material or other adhesive can be used to enhance adhesion between the electronic components 308, 314 and 318 and the elastic substrate 302.

At the step 374, the metal wire 304 is coupled to the metal pads 306, the metal pads 310, the metal pads 316 and the metal pads 320. Similar wire bonding processes as those described in relation to the processes described can be used.

In some embodiments, a plasma cleaning step is performed before coupling the metal wire to the metal pads.

At the step 376, the mold layer 312 is applied over the elastic substrate 302, the metal pads 306, the electronic component 308, the electronic component 314, the electronic component 318 and the metal wire 304.

In some embodiments, an electrical interface to one or more of the electronic components of the stretchable metal wire assembly embodiments is left exposed so as to provide an external electrical connectivity. Such an interface can include, but is not limited to, a metal pad, a metal wire coming off the electrical interconnect component or an interface plug that is part of the electrical interconnect component.

It is understood that other combinations of electronic components, positions of electronic components on the elastic substrate and relative to each other, positions and numbers of the metal pads on the elastic substrate, and the sequence and shape of the metal wires can be used. It is also contemplated that alternative elements to electronic components can be used, such as a removable battery or a display element.

Configuring the stretchable metal wire assembly to have metal pads and using a wire bonding process to apply the metal wires simplifies the fabrication of metal wires having tortuous paths that enable stretching. Wire bonding processes also provide a true solderless process. Additionally, wire bonding processes can be performed at high speed making for fast, high volume production. The metal wire loop heights can be easily adjusted to accommodate different stretching needs The present application has been described in terms of specific embodiments incorporating details to facilitate the understanding of the principles of construction and operation of the stretchable metal wire assembly. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A stretchable metal wire assembly comprising:
   a. an elastic tube having a relaxed, non-stretched state, wherein the elastic tube is configured to be stretched along at least a first direction when a stretching force is applied along the first direction, and to return to the non-stretched state when the stretching force is removed;
   b. a metal wire positioned within the elastic tube, wherein the metal wire forms a tortuous path relative to at least the first direction when the elastic tube is in the non-stretched state thereby enabling bending of the metal wire along at least the first direction upon application and removal of the stretching force; and
   c. one or more adhesive joints wherein each adhesive joint couples a portion of the metal wire to a corresponding inner portion of the elastic tube using an adhesive material while a remaining portion of the metal wire is unattached within the elastic tube.

2. The stretchable metal wire assembly of claim 1 wherein the elastic tube comprises an adhesive property.

3. The stretchable metal wire assembly of claim 1 wherein the metal wire further comprises an adhesive outer coating.

4. The stretchable metal wire assembly of claim 1 wherein the elastic tube comprises one or more of an elastomer, silicone, urethane, latex and elastane.

5. The stretchable metal wire assembly of claim 1 wherein the metal wire comprises one or more of gold, silver, copper, nickel and their alloys.

6. The stretchable metal wire assembly of claim 1 further comprising an insulation layer surrounding the metal wire and a conducting shield surrounding the insulation layer, wherein the metal wire, the insulation layer and the conducting shield comprise a coaxial cable.

7. A stretchable metal wire interconnect comprising:
   a. an elastic tube;
   b. a metal wire positioned within the elastic tube, wherein the metal wire has a first end and a second end, further wherein the metal wire is formed having a tortuous path relative to at least a first direction when the elastic tube is in a non-stretched state;
   c. a first electrical interconnect component coupled to the first end of the metal wire;
   d. a second electrical interconnect component coupled to the second end of the metal wire;
   e. an elastic mold layer encapsulating the elastic tube and at least partially encapsulating the first electrical interconnect component and the second electrical interconnect component, wherein the elastic mold layer, the metal wire and the elastic tube are configured to be stretched along at least the first direction when a stretching force is applied along the first direction, and to return to the nonstretched state when the stretching force is removed; and
   f. the stretchable metal wire interconnect further comprising one or more adhesive joints wherein each adhesive joint couples a portion of the metal wire to a corresponding inner portion of the elastic tube using an adhesive material while a remaining portion of the metal wire is unattached within the elastic tube.

8. The stretchable metal wire interconnect of claim 7 wherein the elastic mold layer and the elastic tube comprise a same material.

9. The stretchable metal wire interconnect of claim 7 wherein the elastic mold layer and the elastic tube comprise a different material.

10. The stretchable metal wire interconnect of claim 7 wherein the elastic mold layer encapsulates the first electrical interconnect component except for an external interface of the first electrical interconnect component.

11. The stretchable metal wire interconnect of claim 10 wherein the elastic mold layer encapsulates the second electrical interconnect component except for an external interface of the second electrical interconnect component.

12. The stretchable metal wire interconnect of claim 7 wherein the metal wire further comprises an adhesive outer coating.

13. The stretchable metal wire interconnect of claim 7 further comprising one or more additional elastic tubes and one or more additional metal wires, one additional metal wire positioned within a corresponding one of the one or more additional elastic wires, each additional elastic tube is positioned adjacent to the elastic tube, wherein each additional metal wire has a first end and a second end.

14. The stretchable metal wire interconnect of claim 13 wherein the first end of each additional metal wire is coupled to the first electrical interconnect component and the second end of each additional metal wire is coupled to the first electrical interconnect component.

15. The stretchable metal wire interconnect of claim 13 further comprising one or more additional electrical interconnect components, wherein the first end of each additional metal wire is coupled to one of the one or more additional electrical interconnect components and the second end of each additional metal wire is coupled to one of the one or more additional electrical interconnect components.

16. The stretchable metal wire interconnect of claim 7 wherein the elastic mold layer comprises one or more of an elastomer, silicone, urethane, latex and elastane.

17. The stretchable metal wire interconnect of claim 7 wherein the elastic tube comprises one or more of an elastomer, silicone, urethane, latex and elastane.

18. The stretchable metal wire interconnect of claim 7 wherein the metal wire comprises one or more of gold, silver, copper, nickel and their alloys.

19. A stretchable metal wire interconnect comprising:
 a. an elastic substrate;
 b. an elastic tube coupled to the elastic substrate;
 c. a metal wire positioned within the elastic tube, wherein the metal wire has a first end and a second end, further wherein the metal wire is formed having a tortuous path relative to at least a first direction when the elastic tube is in a non-stretched state;
 d. a first electrical interconnect component coupled to the first end of the metal wire;
 e. a second electrical interconnect component coupled to the second end of the metal wire;
 f. an elastic mold layer coupled to the elastic tube and the elastic substrate and at least partially encapsulating the first electrical interconnect component and the second electrical interconnect component, wherein the elastic mold layer, the metal wire, the elastic tube and the elastic substrate are configured to be stretched along at least the first direction when a stretching force is applied along the first direction, and to return to the non-stretched state when the stretching force is removed;
 g. the stretchable metal wire interconnect further comprising one or more adhesive joints wherein each adhesive joint couples a portion of the metal wire to a corresponding inner portion of the elastic tube using an adhesive material while a remaining portion of the metal wire is unattached within the elastic tube.

20. The stretchable metal wire assembly of claim 1 wherein the elastic tube comprising a uniform diameter along an elastic tube length.

21. The stretchable metal wire interconnect of claim 7 wherein the first electrical interconnect component is a first printed circuit board assembly and the second electrical interconnect component is a second printed circuit board assembly.

* * * * *